Oct. 15, 1957 T. O. STANLEY 2,810,024
EFFICIENT AND STABILIZED SEMI-CONDUCTOR AMPLIFIER CIRCUIT
Filed March 1, 1954
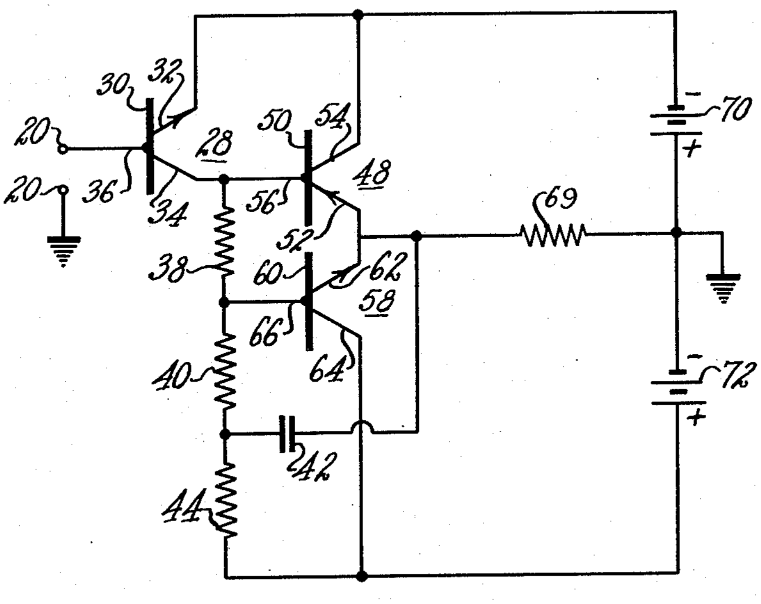
INVENTOR.
THOMAS O. STANLEY
BY H. L. Newton
ATTORNEY United States Patent Office 2,810,024

Patented Oct. 15, 1957

2,810,024

EFFICIENT AND STABILIZED SEMI-CONDUCTOR AMPLIFIER CIRCUIT

Thomas O. Stanley, Princeton, N. J., assignor to Radio Corporation of America, a corporation of Delaware Application March 1, 1954, Serial No. 413,056

7 Claims. (Cl. 179—171)

This invention relates in general to signal amplifier circuits which include an output stage having two signal paths arranged for push-pull operation and in particular to signal amplifier circuits of that type which utilize semi-conductor devices such as transistors as active signal amplifying elements.

It is well known that a junction transistor of the N–P–N type has a symmetrical conduction characteristic when compared with a junction transistor of the P–N–P type. Thus N–P–N and P–N–P type transistors are referred to as being opposite conductivity or complementary symmetry types. Similarly, a point-contact transistor of the P-type is the symmetrical counterpart of a point-contact transistor of the N-type. The symmetrical properties of transistors are more fully described by George C. Sziklai in the "Proceedings of the I. R. E.," June 1953, pages 717–724.

The symmetrical properties of transistors, as referred to above, can be used for many different applications. For example, as described in Sziklai's article, as the base current is changed in the same direction in an N–P–N and a P–N–P transistor respectively, the flow of emitter-collector current will increase in one transistor and decrease in the other transistor. Accordingly, if properly connected, a pair of opposite conductivity transistors will provide a push-pull output. This is achieved, in general, by connecting the transistor in parallel. That is, the corresponding input electrodes of the transistors are connected for signal conduction or amplification to one of the terminals of an input circuit and corresponding output electrodes of the transistors are connected to one of the terminals of an output circuit. One electrode of each transistor may be common to the input and output circuits If appropriate bias voltages are applied to the electrodes of the transistors, their symmetrical properties are such as to produce an opposite output effect from a given input condition. Accordingly, push-pull amplification is possible, and an amplified single-ended output signal may be derived directly from a single-ended input signal. Such an effect is not possible with conventional electron-tube circuits.

The circuit connections for complementary symmetry push-pull amplifiers may assume several different specific forms—depending on the application and particular operating characteristics desired. One known way of connecting such an amplifier is to couple the signal input circuit with the respective base electrodes which are, in turn, connected together. The emitter or output electrodes of the push-pull transistors are connected in common and a load device or utilization means is connected between the emitters and a source of fixed reference potential or ground for the system. The respective collectors are returned to either the positive or negative terminal of the power supply such as a pair of biasing batteries. Such a circuit configuration may be referred to as a common collector complementary symmetry push-pull amplifier.

The common collector complementary symmetry push-pull amplifier circuit, as referred to above, is characterized by relatively simple circuit connections. Hence, a single-ended input signal may be applied to the input circuit and an amplified single-ended output signal may be taken from the load circuit. In addition, the voltage developed across the load appears at the input terminals which increases the input impedance of the amplifier circuit. A push-pull circuit of this type may be driven from a relatively low impedance source such as a base input-collector output N–P–N junction transistor having a collector load resistor which has a relatively low resistance. The use of such a source permits the maximum undistorted voltage which is developed at the input to approach, but never to equal, the voltage that could be developed by an unloaded driving source. Furthermore, such a circuit affords signal degeneration which reduces signal distortion. While possessing these as well as other advantages, such a circuit is characterized by the relatively inefficient coupling of driver current which increases the power requirements of the driver.

For these as well as other advantages of this type of push-pull circuit, it is often preferred as the signal output stage of a radio signal receiver where it is biased for class B operation. For such an application, the chief power drain on the power supply becomes the input power requirements of the driver. Accordingly, a compromise is required between the maximum undistorted voltage which is developed and the efficiency of coupling.

In order to provide stable static operating conditions for a common collector complementary symmetry push-pull amplifier, a low impedance biasing network should be provided for the push-pull transistors. In addition, a direct-current return path must be provided for the driving source. A threshold bias for the push-pull transistors should also be established which is either stable with temperature variations or varies suitably with temperature changes.

While stabilizing the operating point of such a circuit, the use of a low impedance biasing network in combination with the high input impedance of the push-pull stage may shunt a portion of the input signal to ground. Consequently, this portion of the signal will not be able to flow into the base electrodes of the push-pull transistors. Accordingly, while improving the stability, a low impedance biasing network may reduce the efficiency of the circuit. Ideally such a circuit should be characterized by both stable and efficient operation and it is, accordingly, a principal object of the present invention to provide an improved semi-conductor signal translating circuit of the push-pull type which is characterized by stable operation and highly efficient coupling.

It is another object of the present invention to provide an improved class B push-pull audio frequency amplifier circuit which utilizes opposite conductivity transistors as active amplifying elements and a transistor driving stage therefor which are stable and highly efficient in operation.

It is a still further object of the present invention to provide an improved transistor push-pull amplifier circuit, including a transistor driving stage which permits the utilization of a low impedance biasing network for the push-pull power amplifiers to provide stable operation thereof and which is characterized by efficient coupling of driver current to the push-pull stage.

It is yet another object of the present invention to provide an improved semi-conductor amplifying circuit of the push-pull type which utilizes transistors of opposite conductivity types, the input impedance of which may be controlled so as to provide highly efficient utilization of signal energy.

It is still another object of the present invention to provide an improved complementary symmetry push-pull transistor amplifier stage and transistor driver therefor, wherein threshold bias is established for the push-pull stage by the output current of the transistor driver.

These and further objects and advantages of the present invention are achieved, in general, in a common collector complementary symmetry push-pull transistor amplifier circuit by utilizing one resistor network to provide a direct-current return path for the driving stage, which includes another transistor, and to provide threshold bias for the push-pull stage. The respective base electrodes of the push-pull transistors are connected together through a resistor having a relatively small resistance. The output from the driving source such as a further transistor connected in the common emitter configuration may be directly connected with the base of one of the transistors. Hence, the output current from the driving source through the common base resistor establishes the initial threshold bias for the push-pull transistors. Signal feedback means are coupled from the common emitters to a point intermediate the common base resistor and a further series resistor. By this expedient, the efficiency of coupling is increased which permits lower power input to the driver transistor. Furthermore, full realization of the maximum undistorted voltage capabilities of the circuit are assured.

From the foregoing description it will be seen that the invention is adapted for use in the power output stages of radio and like signal receivers.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

The single figure is a schematic circuit diagram of the output stage of a radio signal receiver utilizing a complementary symmetry output stage and transistor driver stage connected in accordance with the present invention.

Referring now to the drawing, the output stage of a signal receiver comprises a first transistor amplifier or driver 28, and a pair of push-pull transistors 48 and 58. Each of the transistors has been illustrated as being of the junction type and comprises a semi-conductive body having three contacting electrodes. Thus, the transistor 28 has a semi-conductive body 30 and three electrodes which are an emitter 32, a collector 34 and a base 36. In the same manner, each of the push-pull output transistors 48 and 58 has a semi-conductive body 50 and 60 and three contacting electrodes which have been designated as emitters 52 and 62, collectors 54 and 64 and bases 56 and 66, respectively. As shown, the first transistor amplifier or driver 28 is of the N-P-N type. Transistor 48 of the push-pull stage is of the P-N-P type. Consequently, transistor 58 must be of the N-P-N type. It should be understood that the specific conductivity types are not critical so long as the biasing and conductivity between stages is correct. Furthermore, it should be noted that the invention is in no way limited to junction transistors. Other transistors such as N and P point-contact transistors or other devices which have operating characteristics which are complementary and symmetrical may be used.

Proper biasing for the driver transistor 28 is obtained by connecting its emitter 32 directly to the negative terminal of the biasing battery 70, and connecting its output or collector electrode 34 through three serially connected resistors, namely the resistors 38, 40 and 44 to the positive terminal of the other biasing battery 72. Further means, not shown, may be provided to establish proper biasing potentials on the base 36. As thus provided, biasing of the driver transistor 28 is proper for amplifying action of an N-P-N transistor. Accordingly, the collector 34 will be positive with respect to the base 36 or biased in a relatively non-conducting or reverse direction, while the emitter 32 will be negative with respect to the base 36 or biased in a relatively conducting or forward direction. The input circuit for the driver transistor 28 is completed by a pair of input terminals 20, one of which is grounded, and the other of which is connected directly with the base 36.

Signal output current, as discussed above, is taken from the collector 34 of the transistor 28, which is connected directly with the base 56 of one of the push-pull transistors 48. The base 56 of the transistor 28 is, in turn, connected through a resistor 38 to the base 66 of the other push-pull transistor amplifier 58. Thus, the output current from the driver transistor flows through the resistor 38 and develops a small initial differential forward bias for the bases 56 and 66 of the respective push-pull transistors. This resistor may have a resistance, by way of example, of 22 ohms. The value is chosen, in any particular instance and for a given set of transistors to minimize cross-over distortion in the push-pull output stage over the operating temperature range, and at the same time to keep the static current in the push-pull transistors at a relatively small value. By substituting a temperature sensitive impedance means for the resistor 38, such as a thermistor, the temperature range over which the circuit will operate acceptably may be extended.

The output circuit for the push-pull stage includes the two emitters 52, 62 of the respective push-pull output transistors 48 and 58 which are connected together as shown. Included in the output circuit is a load resistor 69 which represents any output load and which is connected from the junction of the respective emitters to the center tap of the biasing batteries 70 and 72.

Further biasing voltages for the push-pull output transistors 48 and 58 are obtained by connecting the collector 54 of the transistor 48 directly with the negative terminal of the biasing battery 70 and the collector 64 of the transistor 58 directly with the positive terminal of the biasing battery 72. In addition, the base 66 of the N–P–N push-pull transistor 58 is connected through serially connected biasing resistors 40 and 44 to the positive terminal of the biasing battery 72. The resistors 40 and 44 may have resistances of, by way of example, 180 and 120 ohms, respectively. Hence, two separate bias controls are provided for the output circuit. For one, the operating point of the output circuit is controlled by driver current flow through the resistors 38, 40 and 44 such that the mean voltage of the base electrodes 56 and 66 of the output transistors 48 and 58, respectively, is held at approximately ground potential. In addition, the driver current flow through the resistor 38, as previously described, provides a differential bias for the two output transistors 48 and 58.

As thus described, biasing for the push-pull output transistors 48 and 58 is seen to be proper for amplification action. Furthermore, as described, the biasing network comprising the resistors 38 and 40 is seen to have a low impedance value which establishes a relatively stable operating point. In addition, the resistors 38, 40 and 44 provide a direct-current return path for the driver transistor 28.

It is clear, however, from a consideration of the circuit that the low impedance biasing network for the push-pull output stage is in shunt with the input impedance of the transistors. Furthermore, it is known that the input impedance of a common collector complementary symmetry push-pull stage is relatively high. Thus, under normal circumstances, a portion of the signal appearing in the collector 34 of the driver transistor 28 would be shunted by the biasing network. Accordingly, a substantial portion of the signal would not flow into the respective bases 56 and 66 of the push-pull transistors 48 and 58.

This condition, which would be indicated by a low coupling efficiency, is, of course, undesirable.

Accordingly, to raise the input impedance of the push-pull output stage at signal frequencies, in accordance with another feature of the present invention, a capacitor 42 having a low impedance at signal frequencies, is connected from the junction of the resistors 40 and 44 to the common emitters 52 and 62 of the transistors 48 and 58, respectively. Hence, a signal feedback path is provided for the push-pull output stage. The signal currents so fed back from the emitters of the push-pull stage to the junction of the resistors 40 and 44 will be in phase with the signal at the collector 34 of the driver transistor 28. Accordingly, the impedance at the collector of the driver transistor 34 or in other words, of the push-pull biasing network, will be increased under dynamic operating conditions. It is in this manner that optimum coupling efficiency is realized, while at the same time, full realization of the maximum undistorted voltage capabilities of such a circuit are realized. It has been found that the optimum value of the sum of the resistances of resistors 40 and 44 will be approximately equal to the product of the resistance of the load resistor 69 and the base-to-emitter current gain of the output transistors 48 and 58. The feedback capacitor 42 may have a capacitance of thirty microfarads, for example.

As hereinbefore described, the present invention is seen to provide the benefits of both a relatively low resistance biasing means providing stable operation as well as signal feedback which provides coupling efficiency for the output stage of a signal receiver which includes a common collector complementary symmetry output amplifier and a transistor driver. Accordingly, a circuit constructed in accordance with the invention will be characterized by highly stable as well as efficient operation which also insures full realization of the maximum undistorted voltage capabilities of such a circuit.

In operation, an input signal is applied at the terminals 20 to the base 36 of the driver transistor 28. The amplified current in the collector 34 of the driver transistor 28 will be applied to the base electrodes 56 and 66 of the push-pull output transistors 48 and 58, respectively. As was pointed out above, the collector current from the driver transistor flowing through the resistor 38 which connects the bases of the output transistors is used to establish an initial differential bias for the output transistors. In addition, output current from the driver flowing through the resistors 38, 40 and 44 controls the operating point of the output circuit such that the mean voltage of the bases 56 and 66 of the push-pull transistors 48 and 58, respectively, is held at substantially ground potential. As was also previously explained, the output transistors 48 and 58 are connected to operate in class B push-pull relation.

In view of the fact that the transistor 48 is a P–N–P junction while the transistor 58 is an N–P–N junction, or in other words, that the transistors 48 and 58 are of opposite conductivity types, the signal which is applied to the transistors from the driver transistor 28 will have an opposite symmetrical effect on the emitter current of each of them. Hence, a negative signal will cause the P–N–P transistor 48 to conduct. At the same time, the N–P–N transistor 58 will be non-conductive. A differential current will therefore flow through the output load impedance 69. For positive signals the conduction of the respective transistors will be just the opposite. Hence, the effect on the output circuit of the circuit illustrated is seen to be that of push-pull amplification. The peak-to-peak voltage which is available across the load resistor 69 is less than the battery voltage by the required base-to-emitter voltages in the output transistors 48 and 58 and by the signal voltage which is developed across the dynamic impedance of the batteries. Thus, the peak-to-peak voltage across the load, by virtue of the present invention is nearly equal to the total power supply voltage.

An output circuit embodying the invention incorporates the features of a low impedance biasing network thus insuring stable operation. In addition, the signal feedback from the common emitters of the push-pull transistors provides high efficiency coupling which permits the most effective utilization of the push-pull input signal. Hence, the push-pull circuit embodying the invention is characterized by stable, efficient and low distortion operation.

What is claimed is:

1. In a class B push-pull signal amplifying circuit, the combination with a pair of semi-conductor devices of opposite conductivity type, each of said devices including base, emitter, and collector electrodes, of an input circuit for applying signals to the base electrodes of said pair of devices in parallel, said input circuit including a low resistance biasing network having an impedance element connected between said base electrodes, an output circuit connected in common with the emitter electrodes of each of said devices for deriving an output signal therefrom, and signal feedback means connected between said output circuit and said input circuit, said feedback means having a low impedance at signal frequencies to provide a high dynamic input impedance in combination with said network wherein efficient signal transfer is accomplished.

2. In combination with a first semi-conductor signal amplifying device, push-pull signal amplifying means including a pair of semi-conductor devices of opposite conductivity types each having base, emitter, and collector electrodes, conductive circuit means including a low impedance biasing network coupling said first signal amplifying device with said push-pull signal amplifying means wherein an input signal is applied simultaneously to said base electrodes, said low impedance biasing network including a resistive element connected between said base electrodes and adapted to be traversed by the output current of said second device providing biasing voltages for said pair of semi-conductor devices, and signal feedback means connecting said emitter electrodes with said conductive circuit and providing a relatively high dynamic input impedance for said semi-conductor devices.

3. A signal amplifier adapted for operation as the signal output circuit of signal receivers and the like comprising, in combination, a pair of semi-conductor devices of opposite conductivity types each having emitter, collector and base electrodes, semi-conductor driving means for said pair of devices and operative to simultaneously apply an input signal to each of said base electrodes, an output circuit including a load connected in common with said emitter electrodes, means providing biasing voltages for said electrodes including a low impedance biasing network connected with said base electrodes and operative to provide bias voltages between said base and emitter electrodes, and signal feedback means coupling a point intermediate said emitter electrodes and said load with said network and operative to provide a relatively high dynamic input impedance in combination with said biasing network.

4. In a class B push-pull signal amplifying circuit, the combination with a first and a second semi-conductor device of opposite conductivity types, each of said devices including emitter, collector and base electrodes, of an input circuit for applying signals to the base electrodes, of said pair of devices in parallel, said input circuit including a low impedance biasing network having a resistive element connected between said base electrodes, means connecting the emitter electrode of said first device with the emitter electrode of said second device, an output circuit connected between the emitter electrodes of said devices and a point of fixed reference potential for deriving an output signal therefrom, and signal feedback means connecting a point between said output circuit and said emitter electrodes with said input circuit, said feedback means having a low impedance at signal frequencies to provide a relatively high dynamic input impedance for said semi-conductor devices wherein efficient signal transfer is accomplished.

5. In a signal amplifier, the combination comprising a pair of semi-conductor devices of opposite conductivity types each having base, emitter, and collector electrodes, an input circuit for simultaneously applying an input signal to said base electrodes, an output circuit connected in common with said emitter electrodes, means providing biasing voltages for said electrodes including a low impedance biasing network, said network including a first resistor connected between said base electrodes and a second and third resistor connected in series between said first resistor and a source of biasing potential, and signal feedback means connecting said output circuit with a point intermediate said second and third resistors operative to provide a relatively high dynamic input impedance for said semi-conductor devices.

6. A signal amplifier as defined in claim 5 wherein said electrodes are connected in common and wherein said output circuit includes a load resistor connected between said emitter electrodes and a point of fixed reference potential, said feedback means connecting a point intermediate said emitter electrodes and said load resistor with a point intermediate said second and third resistors.

7. A signal amplifier as defined in claim 6 wherein one of said pair of semi-conductor devices is of the P-N-P junction type and the other of said pair of semi-conductor devices is of the N-P-N junction type, and wherein said feedback means comprises a coupling capacitor.

References Cited in the file of this patent

Terman text, "Radio Engineering," 3rd ed., pages 323–326, pub. 1947 by McGraw-Hill Book Co., N. Y. C.

Shea text, "Principles of Transistor Circuits," pages 341, 342, 349–351, pub. 1953 by John Wiley & Sons, Inc., N. Y. C.

Sziklai article, "Electronic Engineering," Sept. 1953. pages 358–364.